(12) United States Patent
Seo et al.

(10) Patent No.: US 7,943,929 B2
(45) Date of Patent: May 17, 2011

(54) THIN FILM TRANSISTOR AND METHOD OF FABRICATING THE SAME

(75) Inventors: Jin-Wook Seo, Suwon-si (KR); Ki-Yong Lee, Yongin-si (KR); Tae-Hoon Yang, Seongnam-si (KR); Byoung-Keon Park, Incheon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/019,459

(22) Filed: Dec. 23, 2004

(65) Prior Publication Data

US 2005/0275019 A1    Dec. 15, 2005

(30) Foreign Application Priority Data

Jun. 9, 2004   (KR) .................. 10-2004-0042348

(51) Int. Cl.
*H01L 31/0368* (2006.01)
(52) U.S. Cl. ....... 257/49; 257/66; 257/75; 257/E29.288; 257/E29.292
(58) Field of Classification Search .............. 257/49, 257/64, 66, 75, E27.116, E29.273, E29.288, 257/E29.292–E29.293; 438/166, 486
See application file for complete search history.

(56) References Cited

U.S. PATENT DOCUMENTS

| | | | |
|---|---|---|---|
| 5,275,851 A | | 1/1994 | Fonash |
| 5,532,854 A | * | 7/1996 | Fergason ............ 349/200 |
| 5,648,662 A | | 7/1997 | Zhang |
| 5,888,857 A | * | 3/1999 | Zhang et al. ............ 438/162 |
| 6,011,275 A | * | 1/2000 | Ohtani et al. ............ 257/59 |
| 6,346,437 B1 | * | 2/2002 | Maekawa et al. ............ 438/166 |
| 6,420,246 B1 | * | 7/2002 | Yamazaki et al. ............ 438/476 |
| 6,506,636 B2 | * | 1/2003 | Yamazaki et al. ............ 438/149 |
| 6,566,179 B2 | * | 5/2003 | Murley et al. ............ 438/166 |

(Continued)

FOREIGN PATENT DOCUMENTS

JP       07-086607       3/1995

(Continued)

OTHER PUBLICATIONS

Modreanu, M.; Cosmin, P.; Cosmin, S.; Cobianu, C.; Dunare, C.; "Measurement of CVD thin films thickness by sample weighing method." Semiconductor Conference, 1996., International. vol. 2, Oct. 1996 pp. 409-412 vol. 2.*

(Continued)

*Primary Examiner* — Matthew W Such
(74) *Attorney, Agent, or Firm* — H.C. Park & Associates, PLC

(57) ABSTRACT

A thin film transistor and method of fabricating the same are provided. The thin film transistor includes: a metal catalyst layer formed on a substrate, and a first capping layer and a second capping layer pattern sequentially formed on the metal catalyst layer. The method includes: forming a first capping layer on a metal catalyst layer; forming and patterning a second capping layer on the first capping layer; forming an amorphous silicon layer on the patterned second capping layer; diffusing the metal catalyst; and crystallizing the amorphous silicon layer to form a polysilicon layer. The crystallization catalyst diffuses at a uniform low concentration to control a position of a seed formed of the catalyst such that a channel region in the polysilicon layer is close to a single crystal. Therefore, the characteristics of the thin film transistor device may be improved and uniformed.

16 Claims, 5 Drawing Sheets

U.S. PATENT DOCUMENTS

| | | | |
|---|---|---|---|
| 6,613,613 B2 * | 9/2003 | Yamazaki et al. | 438/149 |
| 6,620,661 B2 * | 9/2003 | Maekawa et al. | 438/166 |
| 6,784,455 B2 * | 8/2004 | Maekawa et al. | 257/66 |
| 6,867,074 B2 * | 3/2005 | Tsao | 438/149 |
| 6,884,698 B1 * | 4/2005 | Ohtani et al. | 438/486 |
| 2002/0086471 A1 * | 7/2002 | Maekawa et al. | 438/166 |
| 2003/0155860 A1 * | 8/2003 | Choi et al. | 313/498 |
| 2003/0181043 A1 * | 9/2003 | Tanada et al. | 438/689 |
| 2004/0063258 A1 * | 4/2004 | Kasahara et al. | 438/160 |
| 2004/0101997 A1 * | 5/2004 | Maekawa et al. | 438/151 |
| 2004/0115869 A1 * | 6/2004 | Maekawa et al. | 438/166 |
| 2004/0232459 A1 * | 11/2004 | Takayama et al. | 257/295 |
| 2004/0241934 A1 * | 12/2004 | Inoue | 438/222 |
| 2004/0256618 A1 * | 12/2004 | Imai et al. | 257/59 |
| 2005/0056842 A1 * | 3/2005 | Nishi et al. | 257/66 |
| 2005/0074963 A1 * | 4/2005 | Fujii et al. | 438/623 |
| 2005/0116292 A1 * | 6/2005 | Koo et al. | 257/347 |
| 2006/0130939 A1 * | 6/2006 | Jang et al. | 148/516 |

FOREIGN PATENT DOCUMENTS

| | | | |
|---|---|---|---|
| JP | 08097137 | | 4/1996 |
| JP | 09237760 | | 9/1997 |
| JP | 09260670 | | 10/1997 |
| JP | 11-243209 | | 9/1999 |
| JP | 2000315802 | | 11/2000 |
| JP | 2003528460 | | 9/2003 |
| JP | 2004134533 | | 4/2004 |
| KR | 2003008752 A | * | 1/2003 |
| KR | 1020030021385 | | 3/2003 |
| KR | 10-2003-0060403 A | | 7/2003 |
| KR | 2003060403 A | * | 7/2003 |
| KR | 1020030060403 | | 7/2003 |
| WO | 2004042805 | | 5/2004 |
| WO | WO 2004042805 A1 | * | 5/2004 |

OTHER PUBLICATIONS

Machine Translation of KR 2003060403 A.*

Machine Translation of KR 2003008752 A.*

"Pattern." Dictionary.com Unabridged (v 1.1). Random House, Inc. Nov. 21, 2007. <Dictionary.com http://dictionary.reference.com/browse/pattern>.*

Non-Final Office Action dated Apr. 29, 2009 from U.S. Appl. No. 11/460,654.

Izmajlowicz, M.A.T., et al, "Directional Nickel-Induced Field Aided Lateral Crystallization of Amorphous Silicon", Journal of Applied Physics, vol. 94, No. 12, Dec. 15, 2003, pp. 7535-7541.

Final Office Action issued Dec. 10, 2009 in U.S. Appl. No. 11/460,654.

Non-Final Office Action of U.S. Appl. No. 11/460,654 issued on Oct. 14, 2010.

Jung Chul Kim, et al, "Single-grain thin-film transistor using Ni-mediated crystallization of amorphous silicon with a silicon nitride cap layer", Applied Physics Letters, Dec. 15, 2003, vol. 83, 5068-5070.

Jong Hyun Choi, et al, "Metal Induced Lateral Crystallization of Amorphous Silicon Through a Silicon Nitride Cap Layer", Electrochemical and Solid-State Letters, Nov. 13, 2002. vol. 6, G16-18.

Notice of Allowance of Mar. 25, 2011 in U.S. Appl. No. 11/460,654.

* cited by examiner

THIN FILM TRANSISTOR AND METHOD OF FABRICATING THE SAME

CROSS-REFERENCE TO RELATED APPLICATION

This application claims priority to and the benefit of Korean Patent Application No. 2004-42348, filed Jun. 9, 2004, the disclosure of which is incorporated herein by reference in its entirety.

BACKGROUND OF THE INVENTION

1. Field of the Invention

The present invention relates to a thin film transistor and method of fabricating the same and, more particularly, to a thin film transistor and method of fabricating the same having a metal catalyst layer and first and second capping layers below an amorphous silicon layer.

2. Description of the Related Art

In general, a polysilicon layer has been widely used as a semiconductor layer for thin film transistor since it has high field effect mobility and may be used in a high-speed circuit and a CMOS circuit. The thin film transistor using the polysilicon layer is generally used in an active device of an active matrix liquid crystal display (AMLCD) and switching and driving devices of an organic light emitting diode (OLED).

Here, the polysilicon layer used in the thin film transistor may be fabricated by a direct deposition method, a high-temperature annealing method and a laser annealing method. The laser annealing method may be used in a low-temperature process and implement the high field effect mobility. However, it requires high-cost laser equipment so that a substitute technology has been widely developed.

Currently, a method of crystallizing amorphous silicon using metal has been widely developed since the crystallization is made at a lower temperature and in a shorter time than that of a solid phase crystallization (SPC) method. The metal crystallization method is classified into a metal induced crystallization (MIC) method and a metal induced lateral crystallization (MILC) method. However, even with the metal crystallization method, the characteristics of the thin film transistor device are degraded due to metal contamination.

Meanwhile, in order to reduce the amount of metal and fabricate a high-quality polysilicon layer, there has been developed a method of fabricating a high-quality polysilicon layer through high-temperature processing, rapid thermal annealing or laser illumination by adjusting a concentration of the metal ion using an ion implanter. In addition, in order to planarize the surface of a polysilicon layer using a metal induced crystallization method, a crystallization method of mixing liquid-phase metal and a viscous organic layer, depositing a thin film thereon using a spin coating method, and annealing the resultant has also been developed. However, even with the aforementioned crystallization method, a large-sized grain and grain uniformity, are still problematic, which is critical in the polysilicon layer.

To solve the foregoing problems, a method of fabricating a polysilicon layer through a crystallization method using a cover layer was disclosed in Korean Patent Application No. 2003-0060403. The method includes: depositing a metal catalyst layer on a substrate; forming a capping layer thereon; forming an amorphous silicon layer on the capping layer; diffusing a metal catalyst into the amorphous silicon layer through the capping layer using laser or heat to form a seed; and forming a polysilicon layer using the seed. This method may prevent unnecessary metal contamination since the metal catalyst diffuses through the cover layer. However, even with this method, there still remain problems that it is difficult to control a uniform low concentration of a crystallization metal catalyst and also difficult to control a position of crystallization.

SUMMARY OF THE INVENTION

The present invention, therefore, solves aforementioned problems associated with conventional devices by providing a thin film transistor and method of fabricating the same, in which the crystallization catalyst diffuses at a uniform low concentration to control a position of a seed made of the catalyst such that a channel region in the polysilicon layer is close to a single crystal. Therefore, the characteristics of the thin film transistor device may be improved and uniformed.

In an exemplary embodiment according to the present invention, a thin film transistor includes: a substrate; a metal catalyst layer formed on the substrate; a first capping layer formed on the metal catalyst layer; a second capping layer pattern formed on the first capping layer; and a semiconductor layer pattern formed on the second capping layer pattern. The substrate may be made of glass and the metal catalyst may be formed of nickel (Ni).

The first capping layer and the second capping layer pattern may be formed of silicon nitride layers or silicon oxide layers. Preferably, the second capping layer pattern is thicker than the first capping layer. In addition, the second capping layer pattern may have a higher density than the first capping layer.

An interval between the second capping layer patterns may be 1 to 50 μm. Here, a term "interval of the second capping layer pattern" refers to a distance between one capping layer pattern and an adjacent capping layer pattern.

In another exemplary embodiment according to the present invention, a thin film transistor includes: a substrate; a metal catalyst layer formed on the substrate; a first capping layer pattern formed on the metal catalyst layer; a second capping layer formed on the first capping layer pattern; and a semiconductor layer pattern formed on the second capping layer. The substrate may be made of glass and the metal catalyst may be formed of nickel (Ni).

The first capping layer pattern and the second capping layer may be formed of silicon nitride layers or silicon oxide layers. Preferably, the first capping layer pattern is thicker than the second capping layer. In addition, the first capping layer pattern may have a higher density than the second capping layer.

An interval between the first capping layer patterns may be 1 to 50 μm.

In yet another exemplary embodiment according to the present invention, a method of fabricating a thin film transistor includes: forming a metal catalyst layer on a substrate; forming a first capping layer on the metal catalyst layer; forming and patterning a second capping layer on the first capping layer; forming an amorphous silicon layer on the patterned second capping layer; diffusing the metal catalyst; and crystallizing the amorphous silicon layer to form a polysilicon layer.

In yet another exemplary embodiment according to the present invention, a method of fabricating a thin film transistor includes: forming a metal catalyst layer on a substrate; forming and patterning a first capping layer on the metal catalyst layer; forming a second capping layer on the patterned first capping layer; forming an amorphous silicon layer on the second capping layer; diffusing the metal catalyst; and crystallizing the amorphous silicon layer to form a polysilicon layer.

The metal catalyst layer may be formed by a plasma CVD method or a sputtering method, and the first capping layer and the second capping layer may be formed by a PECVD method.

The metal catalyst may diffuse by an annealing process, and the annealing process is preferably performed at a temperature of 200 to 700° C. The amorphous silicon layer may be crystallized by an annealing process, and the annealing process is preferably performed at a temperature of 400 to 1000° C.

The method may further include: after forming the polysilicon layer, forming a channel layer. The channel layer may be formed apart from an end of the patterned first capping layer by at least 1 to 5 µm.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
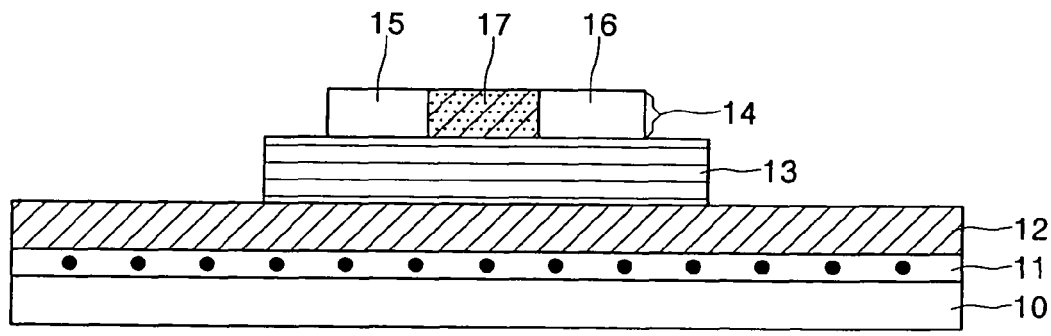
FIG. 1 is a cross-sectional view of a thin film transistor according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a cross-sectional view of a thin film transistor according to a first embodiment of the present invention.

Referring to FIG. 1, a metal catalyst layer 11 is formed on a substrate 10, and a first capping layer 12 is formed on the metal catalyst layer 11. The substrate 10 is preferably an insulating substrate, and may be made of glass. The metal catalyst layer 11 may be formed of nickel (Ni). The first capping layer 12 may be formed of a silicon nitride layer or a silicon oxide layer. Here, the silicon nitride layer or the silicon oxide layer is adjusted to have a small thickness or a low density such that the metal catalyst may diffuse. In other words, the first capping layer 12 acts as a metal catalyst diffusible layer.

A second capping layer pattern 13 is formed on the first capping layer 12. The second capping layer pattern 13 may be made of a silicon nitride layer or a silicon oxide layer. The second capping layer pattern 13 is thicker than the first capping layer 12 or has a higher density than the first capping layer 12 to prevent the metal catalyst to diffuse. In other words, the second capping layer pattern 13 acts as a metal catalyst non-diffusible layer. In general, an oxide layer or a nitride layer acts as a barrier for impurity diffusion. Therefore, with the high-density silicon oxide layer or silicon nitride layer, it may be prevented that the metal catalyst diffuses. On the contrary, when the silicon oxide layer or silicon nitride layer has a low density, the metal catalyst easily diffuses.

Further, the second capping layer pattern 13 is selectively patterned such that the crystallization catalyst may diffuse into an amorphous silicon layer described below. Here, an interval between the second capping layer patterns is preferably 1 to 50 µm in view of low concentration control of the metal catalyst.

The first capping layer 12 and the second capping layer pattern 13 also act as buffer layers. In other words, the first capping layer 12 and the second capping layer pattern 13 act to prevent metal of the metal catalyst layer 11 and contaminants within the substrate 10 from diffusing into the silicon layer.

A semiconductor layer pattern 14 is formed on the second capping layer pattern 13. Source and drain regions 15 and 16 and a channel layer 17 are formed in the semiconductor layer pattern 14. The channel layer 17 may be formed of a silicon layer close to a single crystal.

Figure 2:
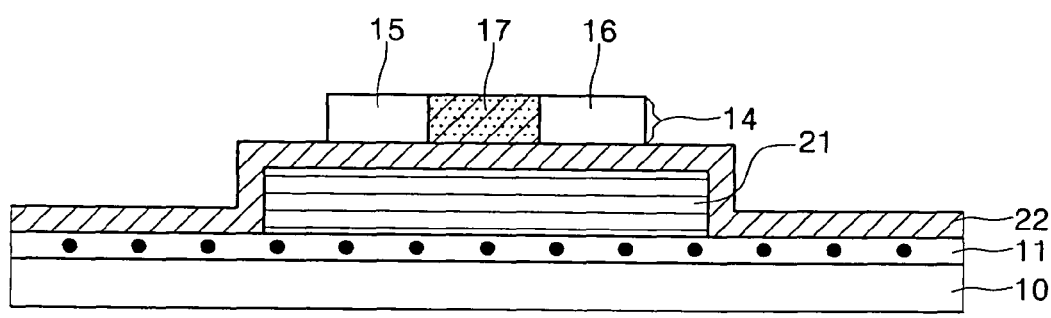
FIG. 2 is a cross-sectional view of a thin film transistor according to a second embodiment of the present invention.

FIG. 2 is a cross-sectional view of a thin film transistor according to a second embodiment of the present invention.

Referring to FIG. 2, a metal catalyst layer 11 is formed is formed on a substrate 10 and a first capping layer pattern 21 is formed on the metal catalyst layer 11. The first capping layer pattern 21 may be made of a silicon nitride layer or a silicon oxide layer. Here, the silicon nitride layer or the silicon oxide layer is adjusted to have a large thickness or a high density such that the metal catalyst cannot diffuse.

A second capping layer 22 is formed on the first capping layer pattern 21. The second capping layer 22 may be made of a silicon nitride layer or a silicon oxide layer. The second capping layer 22 is thinner than the first capping layer pattern 21 or has a lower density than the first capping layer pattern 21 to enable the metal catalyst to diffuse. In other words, the second capping layer 22 acts as a metal catalyst diffusible layer.

The rest of arrangements and functions is the same as that of the thin film transistor according to the first embodiment of the present invention.

FIGS. 3A to 3E are process diagrams illustrating a method of fabricating a thin film transistor according to a first embodiment of the present invention.

Figure 3A:
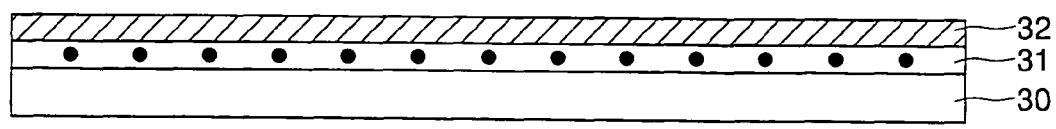
FIGS. 3A to 3E are process diagrams illustrating a method of fabricating a thin film transistor according to a first embodiment of the present invention.

Referring to FIG. 3A, a metal catalyst layer 31 is deposited on a substrate 30. The metal catalyst is preferably formed of nickel (Ni). The metal catalyst layer 31 may be deposited by a sputtering method. Alternatively, the metal catalyst layer 31 may be deposited using ion implantation or plasma. Here, in the method of using plasma, a metal material is arranged on the substrate 30 and exposed to plasma to form the metal catalyst layer 31. A first capping layer 32 is formed on the metal catalyst layer 31. As described above, since the first capping layer 32 acts as a metal catalyst diffusible layer, the first capping layer 32 is formed to have a small thickness or a low density to enable the metal catalyst to diffuse.

Figure 3B:
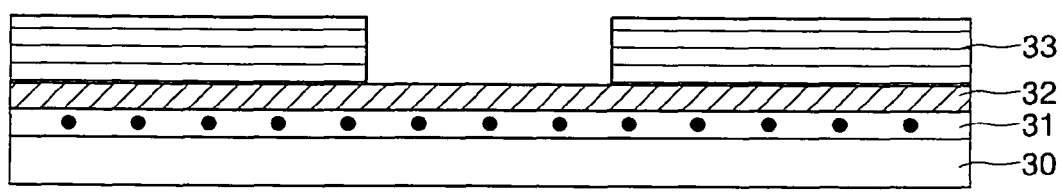

Referring to FIG. 3B, a second capping layer is formed on the first capping layer 32. Since the second capping layer acts as a metal catalyst non-diffusible layer as described above, it is formed thicker than the first capping layer 32 or has a higher density than the first capping layer 32 to disable the metal catalyst to diffuse. Next, the second capping layer is patterned to form a second capping layer pattern 33. Here, a region where the metal catalyst diffuses is selectively patterned such that a seed described below is formed at a desired place.

Figure 3C:
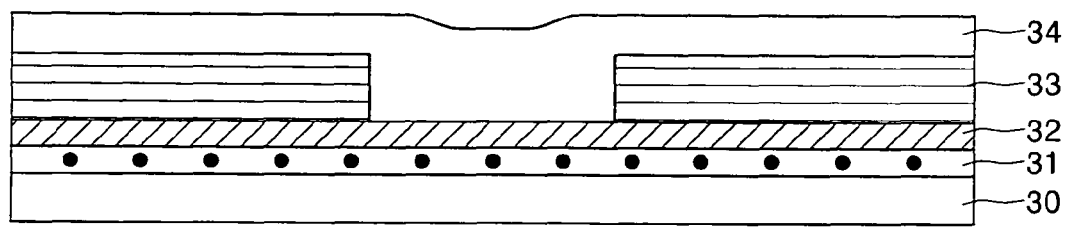

Referring to FIG. 3C, an amorphous silicon layer 34 is formed on the second capping layer pattern 33. The amorphous silicon layer 34 may be formed by a plasma enhanced chemical vapor deposition (PECVD) method.

Figure 3D:
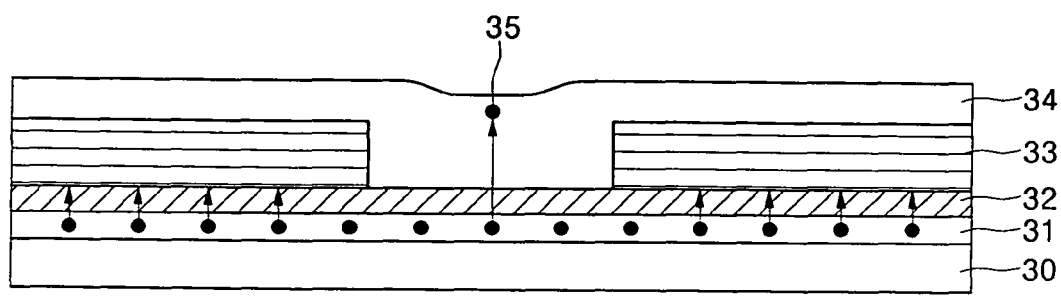

Referring to FIG. 3D, the metal catalyst of the metal catalyst layer 31 diffuses. The diffusion is preferably performed by annealing at a temperature of 200 to 700° C. for 1 hour. The metal catalyst diffuses into the amorphous silicon layer 34 via the first capping layer 32 by the annealing process. The diffused metal catalyst forms a seed 35 in the amorphous silicon layer 34. The seed 34 refers to a metal silicide formed when metal reacts with the silicon. The crystallization described below is performed with the seed 35. In general, only 1/100 of the metal catalyst diffuses to form the seed. The metal catalyst not diffused by the second capping layer pattern 33 is left on the first capping layer 32.

Figure 3E:
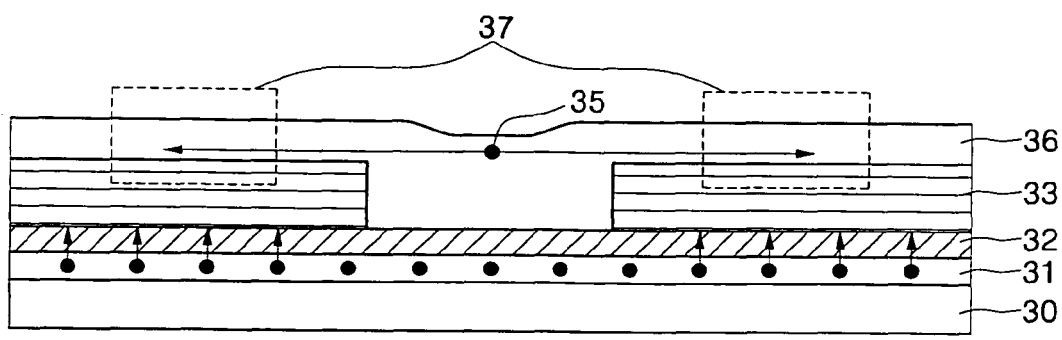

Referring to FIG. 3E, the amorphous silicon layer 34 is crystallized to form a polysilicon layer 36. The crystallization may be performed by an annealing process, which heats for a long time in a furnace. Here, the crystallization is preferably performed at a temperature of 400 to 1000° C. When the annealing process is performed at the above temperature, the seed 35 laterally grows and comes into contact with an adjacent grain to form a grain boundary. Finally, the perfect crystallization may be achieved. The grain of the polysilicon layer 36 formed by the crystallization method reaches 20 to 200 µm or 300 µm in diameter. Therefore, a portion having good crystallinity in the grain is used as a channel formation region 37 to form a channel layer described below. In other words, the channel layer in the semiconductor layer may be formed to be close to a single crystal.

Next, although not shown, the polysilicon layer 36 is patterned to form the source and drain regions and the channel layer through an ion implantation process. In other words, a semiconductor layer pattern is formed. Here, the channel layer 17 is formed in the channel formation region 37 as described above. Preferably, the channel layer 17 is formed apart from an end of the second capping layer pattern 33 by at least 1 to 5 µm to form a channel layer close to a single crystal.

Subsequently, after forming a gate insulating layer on the semiconductor layer pattern, a metal layer and a photoresist layer are sequentially deposited on the gate insulating layer. The photoresist layer is patterned, and the metal layer is etched using the patterned photoresist layer as a mask to form a gate electrode. Using the resultant, the thin film transistor is finally obtained. Here, since the first capping layer and the second capping layer pattern are formed below the semiconductor layer pattern, the process may be performed without separately removing the capping layers.

FIGS. 4A to 4E are process diagrams illustrating a method of fabricating a thin film transistor according to a second embodiment of the present invention.

Figure 4A:
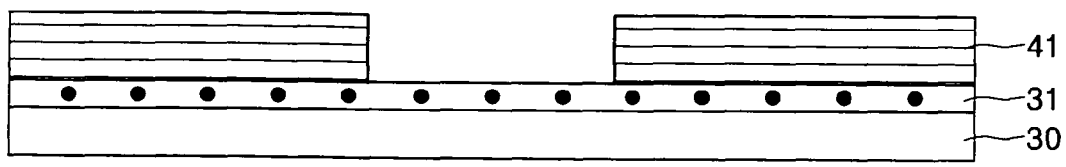
FIGS. 4A to 4E are process diagrams illustrating a method of fabricating a thin film transistor according to a second embodiment of the present invention.

Referring to FIG. 4A, a metal catalyst layer 31 is deposited on a substrate 30. A first capping layer is formed and patterned on the metal catalyst layer 31 to form a first capping layer pattern 41. Here, a region where the metal catalyst diffuses is selectively patterned such that a seed described below is formed at a desired place. As described above, since the first capping layer pattern 41 acts as a metal catalyst non-diffusible layer, the first capping layer pattern is formed to have a large thickness or a high density to disable the metal catalyst to diffuse.

Figure 4B:
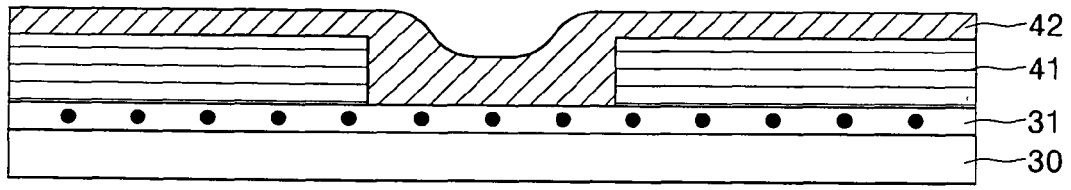

Referring to FIG. 4B, a second capping layer 42 is formed on the first capping layer pattern 41. As described above, since the second capping layer 42 acts as a metal catalyst diffusible layer, the second capping layer is formed to have a smaller thickness or a lower density than the first capping layer pattern 41 to enable the metal catalyst to diffuse.

Figure 4C:
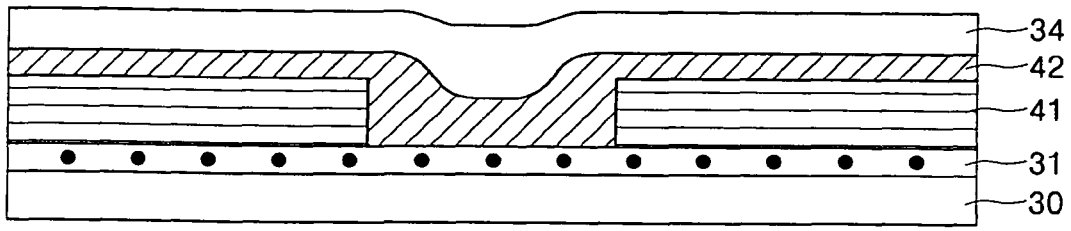
Figure 4D:
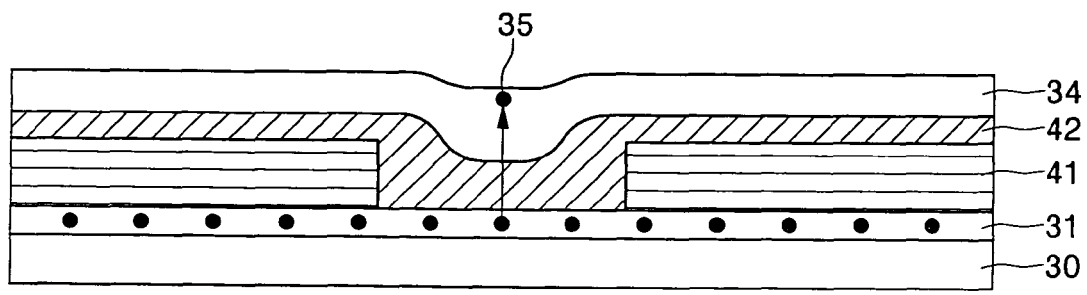
Figure 4E:
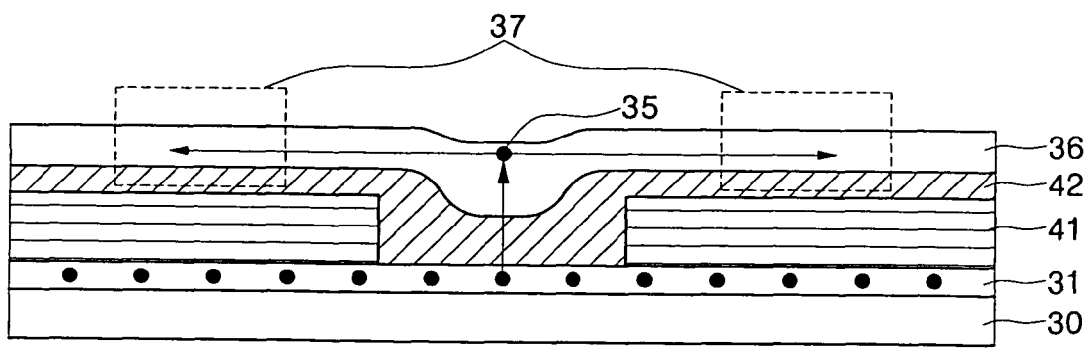

Referring to FIGS. 4C to 4E, an amorphous silicon layer 34 is formed on the second capping layer 42, and a metal catalyst diffuses into the amorphous silicon layer 34 via the second capping layer 42 by an annealing process. Next, a polysilicon layer 36 is formed through crystallization. The rest of arrangement and functions is the same as that of thin film transistor according to the first embodiment of the present invention.

As can be seen from the foregoing, a capping layer is formed below an amorphous silicon layer so that a process may be performed without a need of an additional step for removing the capping layer after crystallizing the amorphous silicon layer. In addition, the crystallization catalyst diffuses at a uniform low concentration to control a position of a seed made of the catalyst such that a channel region in the polysilicon layer is close to a single crystal. Therefore, the characteristics of the thin film transistor device may be improved and uniformed.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor, comprising:
  a substrate;
  a metal catalyst layer formed on and across the entire substrate;
  a first capping layer formed on and across the entire metal catalyst layer;
  a second capping layer pattern formed on and across less than the entire first capping layer; and
  a semiconductor layer pattern formed on the second capping layer pattern and crystallized by a metal catalyst of the metal catalyst layer,
  wherein the metal catalyst layer is between the substrate and the first capping layer, the first capping layer is between the metal catalyst layer and the second capping layer pattern, and the second capping layer pattern is between the first capping layer and the semiconductor layer pattern, and
  wherein the semiconductor layer pattern comprises a channel layer and the channel layer is formed apart from an end of the second capping layer pattern by 1 to 5 µm.

2. The thin film transistor according to claim 1, wherein the first capping layer is formed of any one of a silicon nitride layer and a silicon oxide layer.

3. The thin film transistor according to claim 1, wherein the second capping layer pattern is formed of any one of a silicon nitride layer and a silicon oxide layer.

4. The thin film transistor according to claim 1, wherein the second capping layer pattern is thicker than the first capping layer.

5. The thin film transistor according to claim 1, wherein the second capping layer pattern has a higher density than the first capping layer.

6. The thin film transistor according to claim 1, wherein the second capping layer pattern comprises a plurality of portions having an interval of 1 to 50 µm therebetween.

7. The thin film transistor according to claim 1, wherein the metal catalyst is formed of nickel (Ni).

8. The thin film transistor according to claim 1, wherein the first capping layer is a metal catalyst diffusible layer, and the second capping layer pattern is a metal catalyst non-diffusible layer.

9. A thin film transistor, comprising:
- a substrate;
- a metal catalyst layer formed on and across the entire substrate;
- a first capping layer pattern formed on and across less than the entire metal catalyst layer;
- a second capping layer formed on the first capping layer pattern and across the entire substrate; and
- a semiconductor layer pattern formed on the second capping layer and crystallized by a metal catalyst of the metal catalyst layer,
- wherein the metal catalyst layer is between the substrate and the first capping layer pattern, the first capping layer pattern is between the metal catalyst layer and the second capping layer, and the second capping layer is between the first capping layer pattern and the semiconductor layer pattern, and
- wherein the semiconductor layer pattern comprises a channel layer and the channel layer is formed apart from an end of the first capping layer pattern by 1 to 5 μm.

10. The thin film transistor according to claim 9, wherein the first capping layer pattern is formed of any one of a silicon nitride layer and a silicon oxide layer.

11. The thin film transistor according to claim 9, wherein the second capping layer is formed of any one of a silicon nitride layer and a silicon oxide layer.

12. The thin film transistor according to claim 9, wherein the first capping layer pattern is thicker than the second capping layer.

13. The thin film transistor according to claim 9, wherein the first capping layer pattern has a higher density than the second capping layer.

14. The thin film transistor according to claim 9, wherein the first capping layer pattern comprises a plurality of portions having an interval of 1 to 50 μm therebetween.

15. The thin film transistor according to claim 9, wherein the metal catalyst is formed of nickel (Ni).

16. The thin film transistor according to claim 9, wherein the first capping layer pattern is a metal catalyst non-diffusible layer, and the second capping layer is a metal catalyst diffusible layer.

* * * * *